United States Patent [19]

White et al.

[11] 4,427,713
[45] Jan. 24, 1984

[54] PLANARIZATION TECHNIQUE

[75] Inventors: Lawrence K. White, Cranbury; Metodi Popov, Flemington, both of N.J.

[73] Assignee: RCA Corporation, New York, N.Y.

[21] Appl. No.: 458,757

[22] Filed: Jan. 17, 1983

[51] Int. Cl.³ .............................................. B05D 3/06
[52] U.S. Cl. .................................. 427/54.1; 427/96; 427/375; 427/385.5; 430/192; 430/330; 430/331
[58] Field of Search ............... 427/54.1, 43.1, 53.1, 427/96, 97, 325, 385.5; 430/189, 192, 312, 326, 330, 331

[56] References Cited

U.S. PATENT DOCUMENTS

| 3,873,313 | 3/1975 | Horst et al. | 96/36 |
| 3,971,316 | 7/1976 | Schank et al. | 427/375 |
| 3,976,524 | 8/1976 | Feng | 427/96 |
| 4,004,044 | 1/1977 | Franco et al. | 427/43 |
| 4,015,986 | 4/1977 | Paal et al. | 430/326 |
| 4,171,979 | 10/1979 | Novak et al. | 427/54.1 |
| 4,315,985 | 2/1982 | Castellani et al. | 430/314 |

OTHER PUBLICATIONS

Adams et al. *J. Electrochem. Soc.,* vol. 128, No. 2, 423 (1981).

*Primary Examiner*—John H. Newsome
*Attorney, Agent, or Firm*—Birgit E. Morris; R. Hain Swope

[57] ABSTRACT

A method of planarizing a light sensitive coating on a substrate having topographical features is provided. The coating which comprises a novolak resin and a diazoquinone sensitizer is exposed to actinic radiation to react substantially all of the sensitizer and then heated by applying heat to the surface of the substrate opposite the coating.

6 Claims, No Drawings

PLANARIZATION TECHNIQUE

This invention relates to the planarization of polymeric layers over topographical features on a substrate.

BACKGROUND OF THE INVENTION

The use of spun-on polymer coatings, e.g. as resists for lithographic processing, has become increasingly important in semiconductor manufacture. When such coatings are spun onto substrates having topographical features, changes in the coating thickness often occur at or around the topography. In the instance of a layer of resist material, such thickness variations can, for example, cause dimensional control deviations after development since the entire coating usually receives a uniform amount of irradiation.

More recently, spun-on polymer coatings have been utilized to planarize device topography in multilayer resist processing methods and surface smoothing procedures that utilize dry etching techniques, such as are described by Adams et al., *J. Electrochem Soc.*, Vol. 128, No. 2, 423 (1981). In such procedures, a planarizing layer is often used to smooth topographical features so that a subsequent spun-on resist coating exhibits less substantial thickness variations. Not infrequently, however, such sublayer coatings produce little or no marked improvement in resist thickness variations. It is apparent, therefore, that proper planarization techniques are necessary in order to obtain the maximum benefit from a multilayer resist processing scheme. An improved planarization technique is provided in accordance with this invention.

SUMMARY OF THE INVENTION

A layer of a photosensitive resin composition, preferably spin-coated onto a substrate, is initially irradiated with actinic radiation, and then heated by applying heat to the opposite side of the substrate.

DETAILED DESCRIPTION OF THE INVENTION

The planarizing resin compositions utilized in this invention are well known and are conventionally utilized as photoresists. These compositions are comprised of a novolak resin and a diazoquinone sensitizer therefor. In general, novolak resins are linear phenolic polymers which usually do not form cross-linked structures. Most common are the phenol formaldehyde and cresol formaldehyde novolak resins. The diazoquinone sensitizers, in general, are benzoquinone derivatives or naphthaquinone derivatives, the latter being preferred in the literature pertaining to photoresist compositions.

The solvents present in the subject compositions are those commonly used in commercial photoresist preparations, for example, ethylene glycol monomethyl or monoethyl ether (cellosolve or methylcellosolve), cellosolve or methylcellosolve acetate, butyl acetate and the like. The amount of solvent in the compositions treated in accordance with this invention is not particularly critical nor is the amount of resin or its molecular weight. There should be sufficient solvent so that the substrate can be coated by conventional techniques such as spin-coating and sufficient sensitizer so that, upon irradiation, the composition undergoes the reaction known as bleaching.

The bleaching reaction involves rearrangement and transformation of the diazo group of the sensitizer through a ketene intermediate to a carboxylic acid group. This conversion of the functional group of the sensitizer is essential to the present method as it significantly improves the thermal flow characteristics of the composition. The amounts of sensitizer required to accomplish this object with various resins are known to those of ordinary skill in the art, or are easily discernible by routine experimentation.

Novolak resin/diazoquinone sensitizer compositions commercially available as photoresists are preferred for the method of this invention because of their purity and ready availability. Suitable preparations include HPR 204 and HPR 206 of Hunt Chemical Company, EK 809 of Eastman Kodak Co., AZ1470 and AZ1450J of the Shipley Co. and the like. Similar compositions which do not possess the sharp contrast required for a commercial photoresist preparation would still be suitable for planarization according to this invention. In general, the resin compositions useful herein must adhere well to substrate materials commonly used in the electronics industry and must be compatible therewith and with any additional layers subsequently deposited thereover.

In the process of this invention, the substrate is initially coated with the diazoquinone/novolak composition, preferably by spin-coating. Although not critical to the subject method, it is preferred to spin the substrate at between about 4000 and about 7000 rpm. The thickness of the coating will depend primarily on the topography of the substrate. For example, the coating is preferably between about one and three micrometers thick for one micrometer topographical features. Adjustments in spin speed, solution viscosity and the like which can be made to vary the coating thickness are considered to be within the skill of the art.

The coated substrate is then exposed to actinic radiation, preferably flood exposed with ultraviolet light. It is essential that irradiation be distinct from and precede any heating step which would inactivate the sensitizer and prevent the desired bleaching reaction from taking place. The light wavelength utilized is that recommended for, or determined to be optimum for, the sensitizer present, generally from about 300 to about 450 nm. The coating receives sufficient irradiation to insure that at least the sensitizer in the upper one-third of the coating and, preferably, all of the sensitizer present is reacted. For example, for a coating of the commercial resist HPR 204 one micrometer thick, a dose of 50 mj/cm$^2$ of light at 405 nm is sufficient.

The coating is then heated to a temperature of from about 150° to about 210° C. for a time sufficient to allow thermal flow to occur, generally from about 5 to 30 minutes. It is critical to the method of this invention that the heat be applied to the side of the substrate opposite the coating, thereby heating the coating through from the substrate. This is accomplished by placing the substrate on a heated surface such as a hotplate or a heated moving belt.

The UV irradiation and backside heating procedures each contribute to enhancing the thermal flow and planarizing of the coating on the substrate. Heating the coating through the substrate prevents the formation of a crust on the surface of the coating. The formation of a crust in conventional oven heating has a retarding effect on the flow of the underlying material. The present method is superior to backside heating without irradiation and to flood exposure/conventional oven baking as has been disclosed with regard to a multilayer resist system in U.S. Pat. No. 3,873,313.

Generally, the height of a topographical feature, e.g. a step height, which can be effectively planarized in accordance with this invention should not exceed about ten microns. The subject method is particularly effective with step heights of one micrometer or less which can be planarized to a thickness variation of less than 0.1 micrometer with a coating of planarizing composition 1.5 micrometers thick. Conventional baking of the same coating produces a thickness variation in excess of 0.3 micrometer. While the subject method will produce a planarizing effect even with coatings equal to or slightly greater in thickness than the step height, the coating is advantageously at least one and one-half times the step height and, preferably, from one and one-half to two times the step height of the highest feature on the substrate.

The planarizing results achieved in accordance with the present invention are manifest in comparable line width and space variations when the planarizing layer is utilized as the bottom layer in a multilayer resist structure. In such a structure, portions of an overlying resist layer are irradiated with UV light or an electron beam and the structure is developed by plasma etching, e.g. oxygen plasma etching. The procedure of this invention produces linewidth control in the resist layer of 0.1 micrometer as compared to 0.4 micrometer for a similar structure when the planarizing layer was baked in an oven. The advantages of the subject method are readily apparent to those familiar with multilayer resist processing procedures.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Preparation of Substrates

A coating of thermal oxide was grown on three inch silicon wafer substrates to a thickness of either 0.5 or 1.0 micrometer. The layer of oxide was coated with a layer of positive resist which was patterned with a mask having isolated line features 50, 20, 9, 8, 5 and 3 micrometers, respectively, in width and 500 micrometers in length. The thermal oxide was anisotropically plasma etched to produce near-vertical walls and maintain accurate linewidth dimensions. The resist was removed and the substrates were coated with a 0.5 micrometer thick layer of polycrystalline silicon by low-pressure chemical vapor deposition from silane at 620°. The polycrystalline silicon layer was annealed by heating in a nitrogen atmosphere at 950° for 10 minutes. This procedure was followed to simulate processing of an electronic device.

Coating with Photoresist

All photoresist preparations were utilized in the form supplied by the manufacturer. The preparations tested were: HPR204 and HPR206 of Hunt Chemical Co.; AZ1470 and AZ1450J of Shipley Co. and EK 809 of Eastman Kodak. The photoresists were applied by spin-coating at 4000 to 7000 rpm. to obtain coating thicknesses of 1.3 to 2.2 micrometers.

Baking and Planarizing

The substrates were divided into two groups each containing coatings of all photoresists tested. The first group was irradiated by flood exposure with a high pressure mercury lamp at the wavelength recommended by the manufacturer of each resist. Each substrate received a dose of 100 mJ/cm$^2$ which was sufficient to bleach substantially all of the sensitizer present in the photoresist coatings.

One-half of the irradiated substrates and one-half of the nonirradiated substrates were baked in a batch oven for thirty minutes at 200°. The remainder of each group were placed on a hot-plate and backside heated to 200° for thirty minutes.

Results and Comparisons

The measurement of the planarization profiles was carried out with a Tencor Alpha-Step Profilometer operating with a stylus having a 12 micrometer radius and a 15 mg tracking force. A few SEM micrographs were taken at random to verify the profilometer determinations.

A significant improvement in planarization was achieved by the subject method with each resist tested. Overall, EK 809 exhibited the best planarization. Using HPR206 as a representative composition, the value for thickness variation for a topographical feature 1.0 micrometer high and 10 micrometers wide for each of the four procedures is given in the following table.

TABLE

| Procedure Bake (200°) | Irradiate | Variation Micrometers |
|---|---|---|
| Oven | No | 0.35 |
| Oven | Yes | 0.30 |
| Hotplate | No | 0.30 |
| Hotplate | Yes | 0.08 |

The unexpectedly superior results obtained by the method of this invention are clearly demonstrated by the above test.

EXAMPLE 2

Substrate samples prepared and coated as in Example 1, flood irradiated/oven baked and flood irradiated/hotplate baked, respectively, were coated with a 0.2 micrometer thick layer of silicon dioxide. The silicon dioxide layer, which acts as a hard mask for etching of the underlying layer, was spin-coated with a 0.5 micrometer thick coating of the resist MPR of Hunt Chemical Co. The resist layer was patterned utilizing a mask containing 1.0 micrometer lines and spaces. The silicon dioxide layer was etched by reactive ion etching utilizing a conventional fluorocarbon etch gas mixture. The plasma was changed to pure oxygen and the sublayer was etched. It was found that the use of the subject method allows for linewidth control within 0.1 micrometer as compared to within 0.4 micrometer with the conventional procedure.

What is claimed is:

1. A method of planarizing a coating on a substrate having topographical features, said coating having a thickness at least equal to the highest step height on the substrate and including a novolak resin and a diazoquinone sensitizer, comprising exposing said coating to actinic radiation so as to react the sensitizer in at least the upper one-third of the coating and then heating said coating by applying heat to the substrate on the surface opposite to said coating, thereby heating said coating through from the substrate.

2. A method in accordance with claim 1, wherein the coating is exposed to a sufficient dose of radiation to react substantially all of said sensitizer.

3. A method in accordance with claim 1, wherein said coating is exposed to ultraviolet light between about 300 and 450 nm.

4. A method in accordance with claim 1, wherein said coating is heated to from about 150° to about 210° C.

5. A method in accordance with claim 1, where said coating has a thickness at least about one and one-half times the highest step height on the substrate.

6. A method in accordance with claim 5, wherein said coating has a thickness from about one and one-half to about two times the highest step height on the substrate.

* * * * *